(12) United States Patent
Campbell et al.

(10) Patent No.: US 10,271,459 B2
(45) Date of Patent: Apr. 23, 2019

(54) PROTECTIVE COVER ASSEMBLY FOR AIR-MOVING ASSEMBLY

(71) Applicant: INTERNATIONAL BUSINESS MACHINES CORPORATION, Armonk, NY (US)

(72) Inventors: Levi A. Campbell, Poughkeepsie, NY (US); Christopher R. Ciraulo, Wappingers Falls, NY (US); Milnes P. David, Fishkill, NY (US); Dustin W. Demetriou, Poughkeepsie, NY (US); Robert K. Mullady, Poughkeepsie, NY (US); Roger R. Schmidt, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 964 days.

(21) Appl. No.: 14/565,740

(22) Filed: Dec. 10, 2014

(65) Prior Publication Data
US 2016/0169237 A1 Jun. 16, 2016

(51) Int. Cl.
F04D 25/14 (2006.01)
H05K 7/20 (2006.01)
F04D 29/70 (2006.01)

(52) U.S. Cl.
CPC ....... *H05K 7/20581* (2013.01); *F04D 29/703* (2013.01); *H05K 7/20172* (2013.01); *H05K 7/20727* (2013.01)

(58) Field of Classification Search
CPC .......... H05K 7/20581; H05K 7/20172; H05K 7/20727; F04D 29/703
(Continued)

(56) References Cited

U.S. PATENT DOCUMENTS 3,092,844 A 6/1963 Brunson
3,977,135 A 8/1976 Huntley, Jr.
(Continued)

FOREIGN PATENT DOCUMENTS

CN 2907195 Y 5/2007
CN 202902522 U 4/2013
(Continued)

OTHER PUBLICATIONS

Campbell et al., "Interlock Assembly for Air-Moving Assembly", U.S. Appl. No. 14/499,422, filed Sep. 29, 2014 (36 pages).
(Continued)

*Primary Examiner* — Gregory L Huson
*Assistant Examiner* — Dana Tighe
(74) *Attorney, Agent, or Firm* — Tihon Poltavets, Esq.; Kevin P. Radigan, Esq.; Heslin Rothenberg Farley & Mesiti P.C.

(57) ABSTRACT

Apparatuses and methods are provided for protectively covering an air inlet or outlet of an air-moving assembly. The apparatus includes a protective cover assembly, which includes a retractable cover and a spring-biasing mechanism. The retractable cover transitions between a retracted state, when the air-moving assembly is operatively positioned within the chassis, and in extended state, when the air-moving assembly is withdrawn from the chassis. In retracted state, the retractable cover is retracted away from the air inlet or outlet, and in extended state, the retractable cover covers, at least partially, the air inlet or outlet. The spring-biasing mechanism is coupled to the retractable cover and biases the retractable cover in the extended state when the air-moving assembly is withdrawn from the chassis, and compresses to allow transition of the retractable cover to the retracted state as the air-moving assembly is inserted into operative position within the chassis.

13 Claims, 8 Drawing Sheets

(58) Field of Classification Search
USPC .................................... 454/184, 348, 370
See application file for complete search history.

(56) References Cited

U.S. PATENT DOCUMENTS

| | | | |
|---|---|---|---|
| 4,022,548 A | 5/1977 | Gordon Mclarty | |
| 4,657,485 A | 4/1987 | Hartwig | |
| 5,285,751 A | 2/1994 | Liegeois et al. | |
| 5,562,410 A | 10/1996 | Sach et al. | |
| 6,075,698 A | 6/2000 | Hogan et al. | |
| 6,115,250 A | 9/2000 | Schmitt | |
| 6,663,461 B2 | 12/2003 | Fong | |
| 6,711,013 B2 | 3/2004 | Wobig et al. | |
| 6,714,411 B2 | 3/2004 | Thompson et al. | |
| 6,817,889 B2 | 11/2004 | Chang et al. | |
| 6,837,674 B2 | 1/2005 | Phillips, III | |
| 6,947,281 B2 | 9/2005 | Wycraft et al. | |
| 7,033,206 B2 | 4/2006 | Chang et al. | |
| 7,357,708 B2 | 4/2008 | Lee | |
| 8,056,990 B2 | 11/2011 | Ye | |
| 8,320,121 B2 | 11/2012 | Bisson et al. | |
| 8,425,286 B2 | 4/2013 | Coster et al. | |
| 2002/0141879 A1* | 10/2002 | Winkel ............... | F04D 29/602 417/214 |
| 2005/0186091 A1 | 8/2005 | Zarbi et al. | |
| 2012/0138262 A1* | 6/2012 | Zhang ................ | F04D 25/0613 165/67 |
| 2013/0109290 A1* | 5/2013 | Jones .................. | G06F 1/206 454/184 |
| 2013/0130611 A1 | 5/2013 | Dinicolas | |
| 2013/0167871 A1 | 7/2013 | Jones | |
| 2013/0323044 A1 | 12/2013 | Sun | |
| 2016/0016452 A1 | 1/2016 | Weber et al. | |
| 2016/0084257 A1 | 3/2016 | David et al. | |

FOREIGN PATENT DOCUMENTS

| | | |
|---|---|---|
| CN | 203098342 U | 7/2013 |
| GB | 1 377 387 | 12/1974 |
| JP | 10126079 A | 5/1998 |
| JP | 2002-164681 A | 6/2002 |
| JP | 2006-344661 A | 12/2006 |
| JP | 2008-17099 A | 7/2008 |

OTHER PUBLICATIONS

Campbell et al., "Locking Louver Assembly for Air-Moving Assembly", U.S. Appl. No. 14/499,387, filed Sep. 29, 2014 (35 pages).

Campbell et al., "Protective Louver Assembly for Air-Moving Assembly", U.S. Appl. No. 14/499,402, filed Sep. 29, 2014 (34 pages).

Campbell et al., "Protective Cover Assembly for Air-Moving Assembly", U.S. Appl. No. 16/117,232, filed Aug. 30, 2018 (36 pages).

Campbell et al., "Replacement List of IBM Patents and/or Patent Applications Treated as Related", U.S. Appl. No. 14/565,740, filed Dec. 10, 2014, dated Oct. 26, 2018 (2 pages).

* cited by examiner

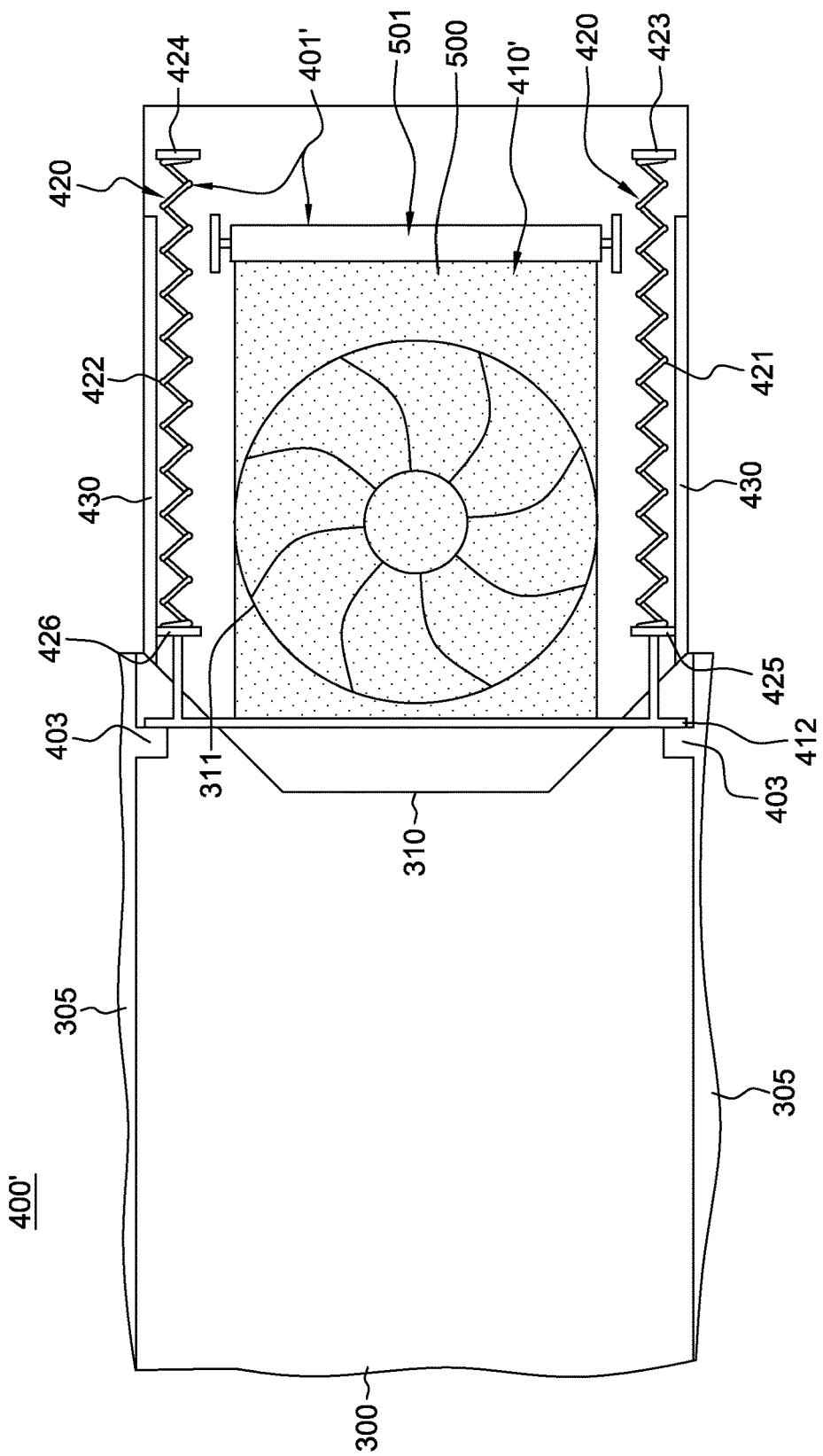

PROTECTIVE COVER ASSEMBLY FOR AIR-MOVING ASSEMBLY

BACKGROUND

In many server applications, processors along with their associated electronics (e.g., memory, disk drives, power supplies, etc.) are packaged in removable drawer or subsystem configurations stacked within an electronics rack or frame comprising information technology (IT) equipment. In other cases, the electronics may be in fixed locations within the rack or frame. As circuit densities continue to increase at all levels of packaging, there is an ever-growing need for providing continuous cooling to the electronics rack, including the electronic subsystems thereof. As one solution, a cooling apparatus may be provided which includes one or more air-moving assemblies (e.g., axial fans or centrifugal fans) which facilitate moving an airflow through the electronics rack, usually front-to-back.

In certain implementations, multiple air-moving assemblies may be provided in association with a drawer or electronics subsystem in order that the assemblies may be concurrently maintainable, such that if one fails, the failure does not stop airflow through the electronics subsystem, and thus negatively affect operational availability of computing resources to the customer. In the event that a non-quiesced air-moving assembly is mistakenly removed, the fan or impeller wheel may still be rotating at a high speed, for instance, at 4000 RPMs or above, and have significant momentum, due to the mass of the fan or impeller. This action could potentially result in injury to the operator removing the air-moving assembly.

BRIEF SUMMARY

The shortcomings of the prior art are overcome and additional advantages are provided through the provision, in one aspect, of an apparatus which includes a protective cover assembly. The protective cover assembly is configured to couple to an air-moving assembly adjacent to one of an air inlet or an air outlet thereof, with the air-moving assembly being removable from a chassis within which the air-moving assembly resides in operative position. The protective cover assembly includes a retractable cover and a spring-biasing mechanism coupled to the retractable cover. The retractable cover is in a retracted state when the air-moving assembly is operatively positioned within the chassis, and transitions to an extended state when the air-moving assembly is withdrawn from the chassis. In the retracted state, the retractable cover is retracted away from the one of the air inlet or air outlet of the air-moving assembly, and in the extended state, the retractable cover covers, at least in part, the one of the air inlet or the air outlet of the air-moving assembly. The spring-biasing mechanism biases the retractable cover in the extended state when the air-moving assembly is withdrawn from the chassis, and compresses to allow transition of the retractable cover to the retracted state as the air-moving assembly is inserted into operative position within the chassis.

In another aspect, an apparatus is provided which includes an air-moving assembly and a protective cover assembly. The air-moving assembly, which resides within a chassis when in operative position and is removable from the chassis, includes an air inlet and an air outlet. The protective cover assembly is coupled to the air-moving assembly adjacent to one of the air inlet or the air outlet, and includes a retractable cover and a spring-biasing mechanism. The retractable cover is in a retracted state when the air-moving assembly is operatively positioned within the chassis, and transitions to an extended state when the air-moving assembly is withdrawn from the chassis. In the retracted state, the retractable cover is retracted away from the one of the air inlet or air outlet of the air-moving assembly, and in the extended state, the retractable cover covers, at least in part, the one of the air inlet or the air outlet of the air-moving assembly. The spring-biasing mechanism is coupled to the retractable cover and biases the retractable cover in the extended state when the air-moving assembly is withdrawn from the chassis, and compresses to allow transition of the retractable cover to the retracted state as the air-moving assembly is inserted into operative position within the chassis.

In a further aspect, a method is provided which includes: associating a protective cover assembly with an air-moving assembly adjacent to one of an air inlet or an air outlet thereof, the air-moving assembly residing within a chassis when in operative position, and being removable from the chassis. The protective cover assembly includes: a retractable cover, the retractable cover being in a retracted state when the air-moving assembly is operatively positioned within the chassis, and transitioning to an extended state when the air-moving assembly is withdrawn from the chassis, wherein in the retracted state, the retractable cover is retracted away from the one of the air inlet or air outlet of the air-moving assembly, and in the extended state, the retractable cover covers, at least in part, the one of the air inlet or the air outlet of the air-moving assembly; and a spring-biasing mechanism coupled to the retractable cover, the spring-biasing mechanism biasing the retractable cover in the extended state when the air-moving assembly is withdrawn from the chassis, and compressing to allow transition of the retractable cover to the refracted state as the air-moving assembly is inserted into operative position within the chassis.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 5 depicts an alternate embodiment of the apparatus of FIGS. 4A-4C, with the retractable cover of the protective cover assembly shown in the extended state, and the air-moving assembly shown withdrawn from operative position within the chassis, in accordance with one or more aspects of the present invention;

DETAILED DESCRIPTION

As used herein, the term "electronics rack" refers to any housing, frame, rack, compartment, blade server system, etc., having one or more heat-generating components of a computer system, electronic system, or information technology (IT) equipment, and may include, for example, a stand-alone computer processing system having high, mid, or low-end processing capability. In one embodiment, an electronics rack may include one or more electronic subsystems, for example, in one or more servers, sub-housings, blades, drawers, nodes, compartments, boards, etc., having one or more heat-generating electronic components disposed therein or thereon. An electronic system or subsystem may be removable or fixed, for example, relative to an electronics rack, with rack-mounted electronic drawers of an electronics rack and blades of a blade-center system being two examples of electronic systems or subsystems of an electronics rack to be cooled. In addition, as used herein, the term "chassis" or "electronics chassis" refers to any housing, container, frame, rack, compartment, etc., and may be, in one embodiment, an electronics rack, or an electronic subsystem chassis which, for instance, forms part of or resides within an electronics rack.

Reference is made below to the drawings, where the same reference numbers used throughout different figures designate the same or similar components.

Figure 1:
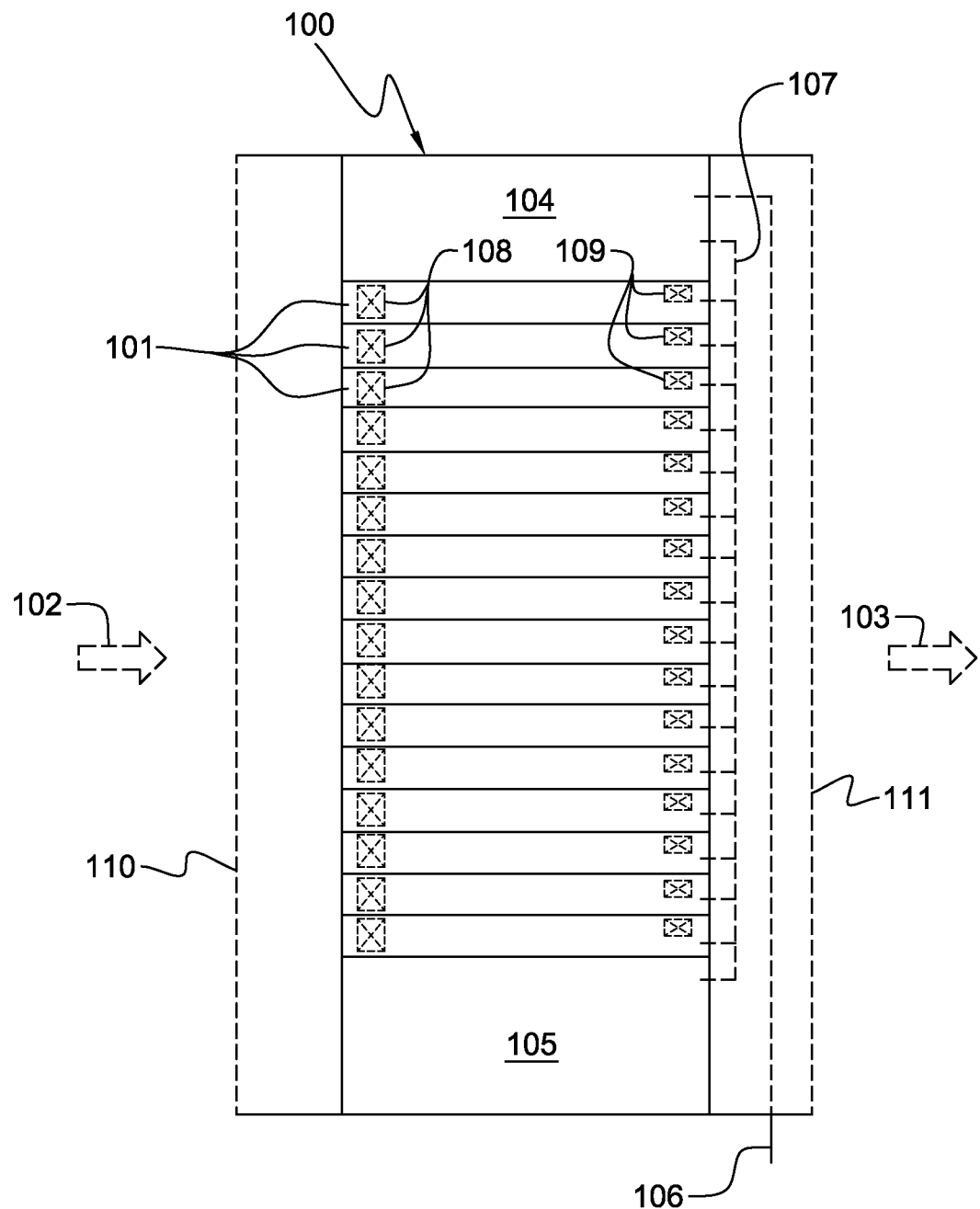
FIG. 1 is an elevational depiction of one embodiment of an electronics rack, which may incorporate therein one or more apparatuses, in accordance with one or more aspects of the present invention.

FIG. 1 depicts (by way of example) one embodiment of an electronics rack 100 with a plurality of electronic subsystems 101 to be cooled. In the embodiment illustrated, electronic subsystems 101 are air-cooled by cool airflow 102 ingressing via an air inlet 110, and exhausting out an air outlet 111 as hot airflow 103. One or more air-moving assemblies 108 may be provided at the air inlet sides of electronic subsystems 101 and/or one or more air-moving assemblies 109 may be provided at the air outlet sides of electronic subsystems 101 to facilitate airflow through the individual subsystems 101 as part of the cooling apparatus of electronics rack 100. By way of example, air-moving assemblies 108 at the air inlets to electronic subsystems 101 may be or include axial fan assemblies, and air-moving assemblies 109 disposed at the air outlets of electronic subsystems 101 may be or include centrifugal fan assemblies. One or more of electronic subsystems 101 may include heat-generating components to be cooled of a computer system, electronics system, or information technology (IT) equipment. For instance, one or more of the electronic subsystems 101 may include one or more processors and associated memory.

Electronics rack 100 may also include, by way of example only, one or more bulk power assemblies 104 of an AC to DC power supply assembly. AC to DC power supply assembly further includes, in one embodiment, a frame controller, which may be resident in the bulk power assembly 104 and/or in one or more electronic subsystems 101. Also illustrated in FIG. 1 is one or more input/output (I/O) drawer(s) 105, which may also include a switch network. I/O drawer(s) 105 may include, as one example, PCI slots and disk drivers for the electronics rack.

In implementation, a three-phase AC source may feed power via an AC power supply line cord 106 to bulk power assembly 104, which transforms the supplied AC power to an appropriate DC power level for output via distribution cable 107 to the plurality of electronic subsystems 101 and I/O drawer(s) 105. The number of electronic subsystems installed in the electronics rack is variable, and depends on customer requirements for a particular system. Further, although described with reference to multiple electronic subsystems 101, the air-moving assemblies discussed herein could reside within, for instance, bulk power assembly 104, or I/O drawer(s) 105. Again, the particular electronics rack configuration of FIG. 1 is presented by way of example only, and not by way of limitation.

Figure 2:
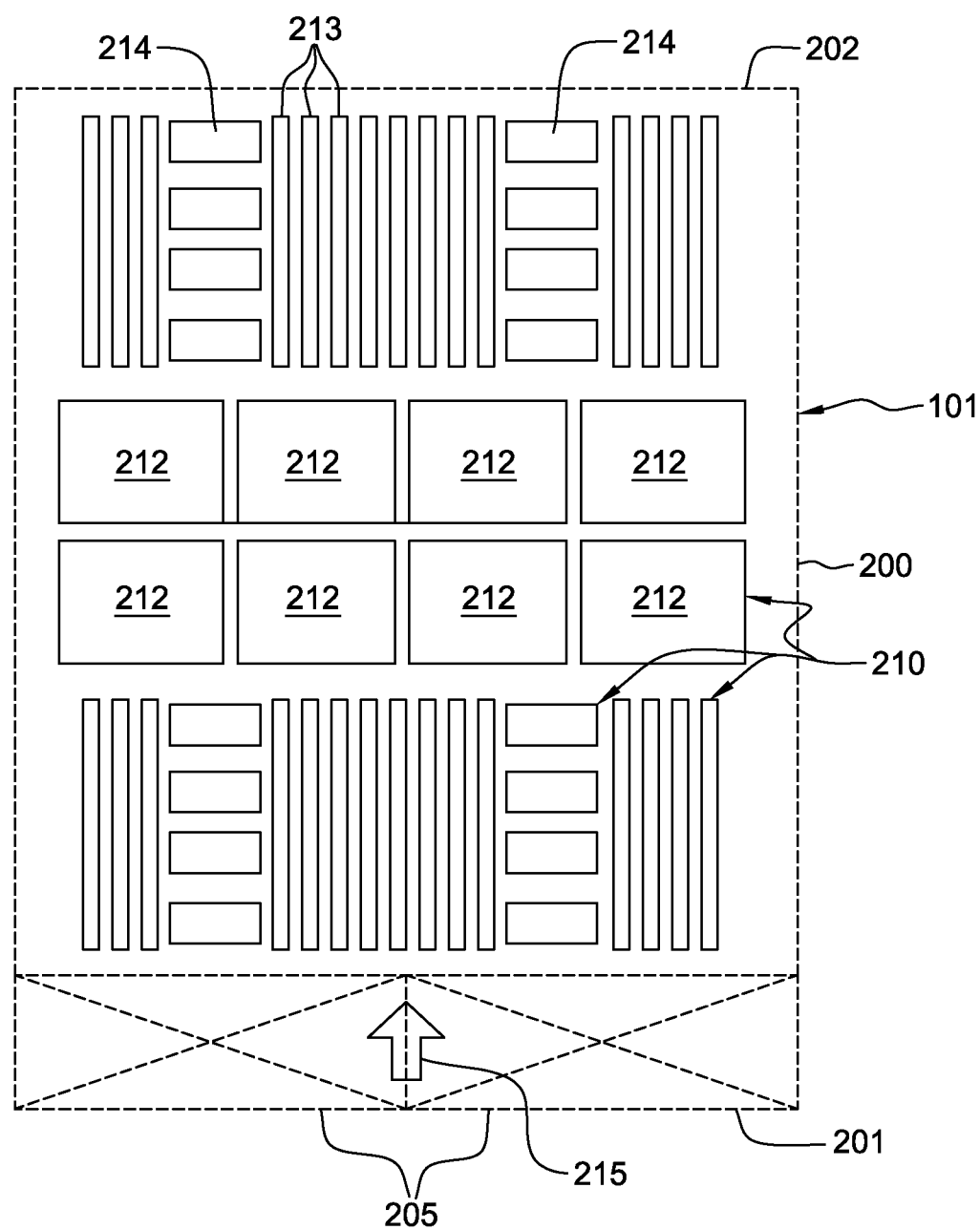
FIG. 2 is a plan view of one embodiment of an electronic subsystem layout illustrating multiple air-moving assemblies at an air inlet side of the electronic subsystem chassis, and which may incorporate one or more apparatuses, in accordance with one or more aspects of the present invention.

FIG. 2 depicts one embodiment of an electronic subsystem 101 layout which includes a chassis 200 being air-cooled utilizing one air-cooling approach, where one or more air-moving assemblies 205 provide forced airflow 215 in operational state to cool multiple electronic components 210 within electronic subsystem 101. Cool air is taken in through an air inlet 201 and heated air is exhausted out an air outlet 202 of the electronic subsystem. The multiple components 210 to be cooled may include, by way of example, multiple processor modules 212, as well as multiple arrays of memory modules 213 (e.g., dual-in-line memory modules (DIMMs)) and multiple rows of memory support modules 214 (e.g., DIMM control modules). In one implementation, air-cooled heat sinks (not shown) may be coupled to one or more of processor modules 212, memory modules 213, and/or memory support modules 214 to facilitate dissipation of heat therefrom.

In the depicted example of FIG. 2, the air-moving assemblies 205, as well as the electronic components, reside within chassis 200 containing or supporting the electronic subsystem. Also, as depicted, the air-moving assemblies 205 disposed at the air inlet side 201 of the electronic subsystem may be redundant fan assemblies, which concurrently provide the cooling airflow 215 across or through the electronic components of the electronic subsystem.

Figure 3A:
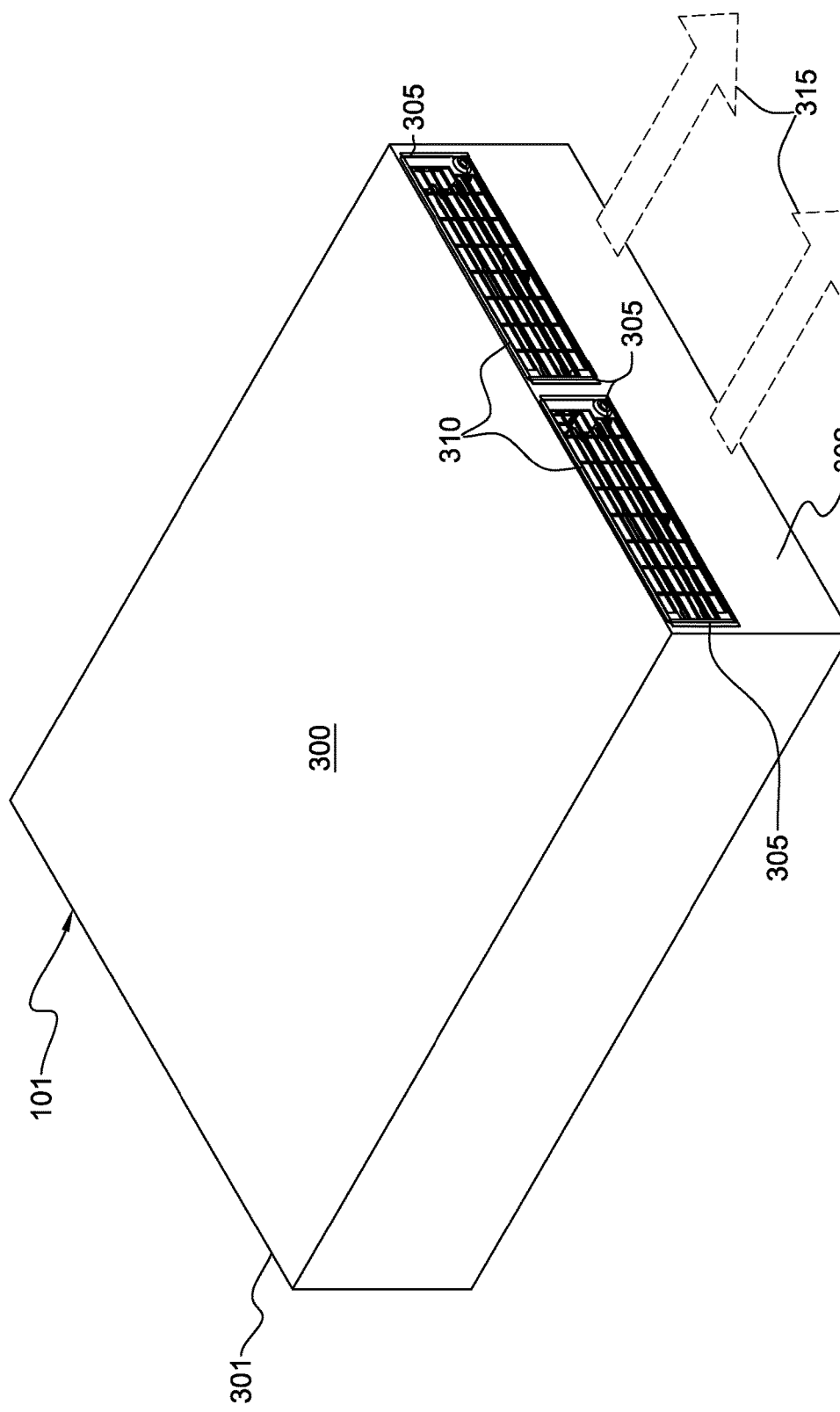
FIG. 3A depicts one embodiment of a chassis with multiple air-moving assemblies disposed at an air outlet side of the chassis, and which may incorporate one or more apparatuses, in accordance with one or more aspects of the present invention.

FIG. 3A partially depicts an alternate embodiment of an electronic subsystem 101 layout which includes a chassis 300, and redundant air-moving assemblies 310 disposed at an air outlet side 302 of the electronic subsystem, with the air inlet side 301 being, by way of example, at an opposite side of chassis 300. Redundant air-moving assemblies 310 are operatively positioned within chassis 300 within, for instance, respective receiving tracks 305, which are a part of or affixed to chassis 300. In FIG. 3A, air-moving assemblies 310 are shown operational, with an airflow 315 exiting the air outlets thereof.

Figure 3B:
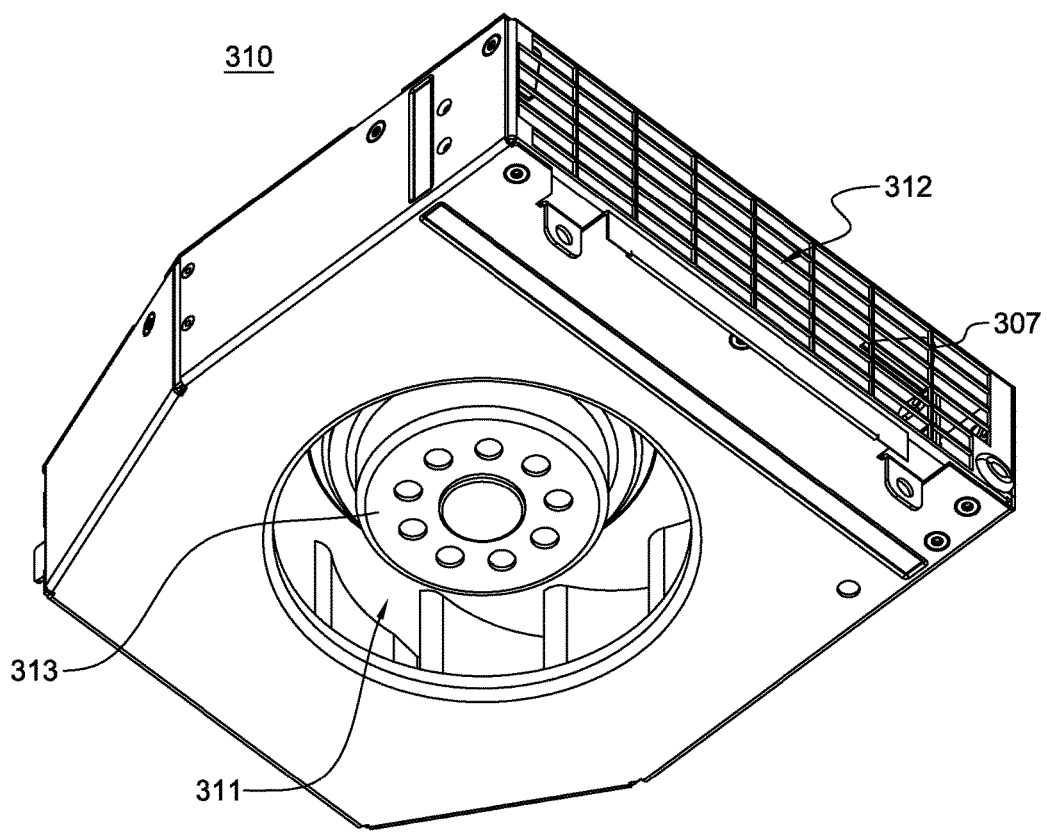
FIG. 3B depicts one embodiment of an air-moving assembly of FIG. 3A, shown removed from the chassis.

FIG. 3B depicts one embodiment of air-moving assembly 310 of FIG. 3A. In this embodiment, air-moving assembly 310 is depicted as a centrifugal fan assembly with a relatively large air inlet opening 311 in a lower surface thereof, exposing the centrifugal blower 313, and an air outlet 312, which may have a grating 307 as a safety feature. As noted above, in many systems today, air-moving assemblies may be designed to be concurrently maintainable, so that one assembly entering into a quiesced state does not significantly impact system cooling, and thus operational availability of computing resources to a customer. In the event that an operating air-moving assembly 310 is removed, the fan or impeller wheel may be spinning at a high speed, and have significant momentum due to its mass. This could result in injury to the operator removing the assembly, particularly in a centrifugal fan design such as illustrated in FIG. 3B, where there is a relatively large air inlet 311 within the assembly.

One possible solution to the issue is to provide a fixed grill with openings smaller than an operator's fingers at the air assembly's inlet. However, this could significantly impede airflow through the assembly. An alternate approach is to disallow redundancy for concurrent replaceability, which is undesirable, since a customer could experience a computing outage due to a single air-moving assembly transitioning to quiesced state, for instance, due to a failure.

As a solution, disclosed herein are apparatuses and methods which address the above-noted drawbacks to existing concurrently-maintainable, air-moving assemblies. The apparatuses may include, for instance, a protective cover assembly. The protective cover assembly is configured to couple to an air-moving assembly (such as an axial fan or centrifugal fan) adjacent to one of an air inlet or an air outlet thereof, with the air-moving assembly being removable from a chassis within which the air-moving assembly resides in operative position. By way of example, the protective cover assembly may be sized and configured to reside within an enclosure of the air-moving assembly, that is, where there is sufficient clearance within the enclosure to accommodate a protective cover assembly, such as described herein. The protective cover includes a retractable cover and a spring-biasing mechanism coupled to the retractable cover. The retractable cover is in a retracted state when the air-moving assembly is operatively positioned within the chassis, and transitions to an extended state as the air-moving assembly is withdrawn from the chassis. In the retracted state, the retractable cover is retracted away from the air inlet or air outlet of the air-moving assembly, and in the extended state, the retractable cover covers, at least in part, the air inlet or air outlet of the air-moving assembly. The spring-biasing mechanism biases the cover to the extended state when the air-moving assembly is withdrawn from the chassis, and compresses to allow transition of the retractable cover to the retracted state as the air-moving assembly is inserted into operative position within the chassis.

In one or more implementations, the protective cover assembly further includes a movable crossbar coupled to the retractable cover and the spring-biasing mechanism, and sized to span, at least in part, the air inlet or air outlet of the air-moving assembly when the protective cover assembly is coupled thereto. In operation, one or more chassis elements, such as chassis tabs associated with the assembly receiving tracks of the chassis, engage the movable crossbar with insertion of the air-moving assembly into operative position within the chassis. This engaging results in compressing the spring-biasing mechanism as the air-moving assembly is placed or docked in operative position within the chassis, and allows the transition of the retractable cover to the retracted state, retracted away from the air inlet or air outlet of the air-moving assembly.

In certain implementations, the spring-biasing mechanism may comprise one or more linear spring mechanisms, sized and configured to bias the retractable cover to the extended state when the protective cover assembly is coupled to the air-moving assembly and the air-moving assembly is withdrawn from the chassis, and to compress to allow transition of the retractable cover to the retracted state as the air-moving assembly is inserted in operative position within the chassis.

In one or more embodiments, the protective cover assembly may include a movable crossbar sized to span the air inlet or the air outlet of the air-moving assembly when the protective cover assembly is coupled thereto. The movable crossbar is engaged by at least one chassis tab associated with the chassis as the air-moving assembly is operatively inserted within the chassis. In certain embodiments, the spring-biasing mechanism may include a first linear spring and a second linear spring coupled to the movable crossbar at opposite sides of the air inlet or air outlet of the air-moving assembly. In these configurations, the movable crossbar is coupled to the retractable cover to facilitate movement of the retractable cover from the extended state to the retracted state upon engagement by the one or more chassis tabs as the air-moving assembly is operatively positioned within the chassis.

In certain embodiments, the retractable cover may be, or may include, an accordion mesh cover configured to substantially cover the air inlet or air outlet when the protective cover assembly is coupled to the air-moving assembly, and the retractable cover is in the extended state.

In other embodiments, the protective cover assembly may include a movable crossbar sized to span the air inlet or air outlet of the air-moving assembly, and the retractable cover may include a torsion spring and a cover sheet, with the cover sheet being attached at one end to the torsion spring, and at an opposite end, to the movable crossbar. The torsion spring is configured to facilitate movement of the cover sheet to the retracted state, retracted away from the air inlet or air outlet of the air-moving assembly as the air-moving assembly is operatively positioned within the chassis. In implementation, the spring-biasing mechanism provides a greater biasing force than the torsion spring to facilitate unwinding of the cover sheet to the extended state as the air-moving assembly is withdrawn from the chassis.

In certain other implementations, the retractable cover includes a plurality of slats connected together via coupling rings along their edges, with the plurality of slats being configured to substantially cover the air inlet or the air outlet of the air-moving assembly in extended state as the air-moving assembly is withdrawn from the chassis. In these configurations, the protective cover assembly may further include first and second tracks coupled to the air-moving assembly on opposite sides of the air inlet or air outlet, with the plurality of slats including a plurality of slat tabs disposed at opposite ends thereof. The plurality of slat tabs move within their respective first and second tracks of the protective cover assembly with extension or retraction of the retractable cover.

Note that the above-summarized examples of protective cover assemblies are provided by way of example only. In one detailed implementation, the air-moving assembly is a centrifugal fan, and the protective cover assembly couples to the air-moving assembly adjacent to the air inlet thereof to protectively cover the air inlet as the air-moving assembly is withdrawn from operative position within the chassis. In this manner, the protective cover assembly automatically covers the air inlet (or air outlet) as the air-moving assembly is withdrawn from operative position, notwithstanding that the fan or impeller wheel may still be rotating, which advantageously reduces the possibility of injury to the operator removing the air-moving assembly. The retractable cover may be implemented, in certain embodiments, as a safety screen which remains out of the airflow path when in retracted state, and extends to cover the adjacent air-moving assembly opening (e.g., inlet or outlet) as the assembly is removed from operative position within the mating housing or chassis, thereby ensuring the operator's safety. Note that the protective cover assembly disclosed herein may be a distinct assembly which can subsequently be added to an existing air-moving assembly, such as for instance, within the air-moving assembly enclosure. Alternatively, the protective cover assembly could be provided as part of the air-moving assembly during initial fabrication of the air-moving assembly.

In the various embodiments described herein, when the air-moving assembly is installed in operative position within the mating chassis or housing of the electronic system or subsystem, tabs in the housing, for instance, associated with (or disposed near) receiving tracks of the chassis provided to facilitate operative insertion of the air-moving assembly within the chassis, engage the protective cover assembly, and push the retractable cover from extended state to retracted state as the assembly is slid into position within the chassis. This may be accomplished (in one embodiment) by providing one or more slots in the air-moving assembly enclosure, to allow the chassis tab(s) to extend into the air-moving assembly enclosure and contact the protective cover assembly, and in so doing, compress the spring-biasing mechanism as the air-moving assembly is operatively inserted within the chassis. In one or more implementations, this action advantageously moves the retractable cover out of the airflow path, that is, the action retracts the retractable cover away from the associated air inlet or air outlet of the air-moving assembly. Thus, when installed in operative position within the chassis, the retractable cover does not extend over the inlet or outlet, and therefore does not add impedance to the airflow path through the assembly.

Should the air-moving assembly require a maintenance action, or need to be replaced, the assembly could be removed from the chassis. During the removal process, the air-moving assembly is withdrawn from the chassis, and as the assembly is being withdrawn, the chassis tab(s) recedes back along the air-moving assembly enclosure slot(s), allowing the spring-biasing mechanism to extend out the retractable cover to its natural, extended state. In this state, the retractable cover is configured and sized to, for instance, substantially cover the adjacent air inlet or air outlet opening of the air-moving assembly in order that an operator could not accidently come into contact with a still-rotating fan or impeller wheel. The portion of the air-moving assembly having the protective cover assembly need not be manufactured as a single unit, but rather, the protective cover assembly could be separately fabricated and then secured to the air-moving assembly, for instance, to one or more inner surfaces of the air-moving assembly enclosure, assuming that there is adequate clearance within the air-moving assembly enclosure for addition of the protective cover assembly.

Figure 4A:
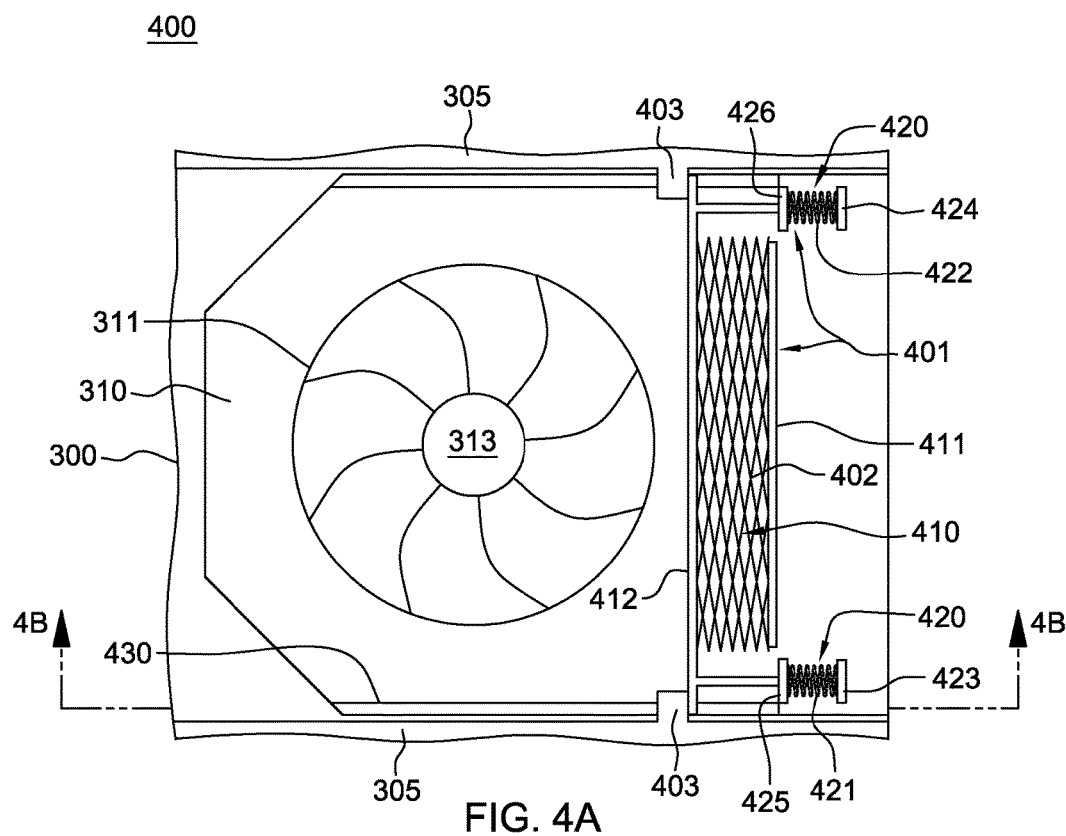
FIG. 4A is a plan view of one embodiment of an apparatus comprising an air-moving assembly and a protective cover assembly, with the air-moving assembly shown in operative position within a chassis, in accordance with one or more aspects of the present invention.
Figure 4B:
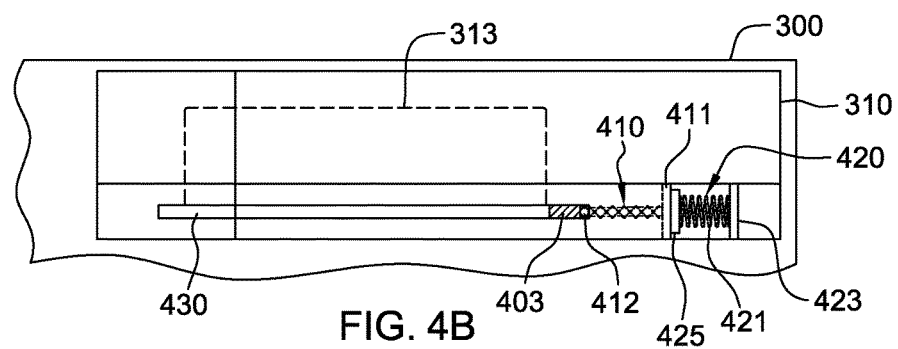
FIG. 4B is a side elevational depiction of the apparatus of FIG. 4A, taken along line 4B-4B thereof, with the movable crossbar of the protective cover assembly shown engaged by chassis tabs that hold the retractable cover in the retracted state, retracted (in this example) from the air inlet of the air-moving assembly, in accordance with one or more aspects of the present invention.
Figure 4C:
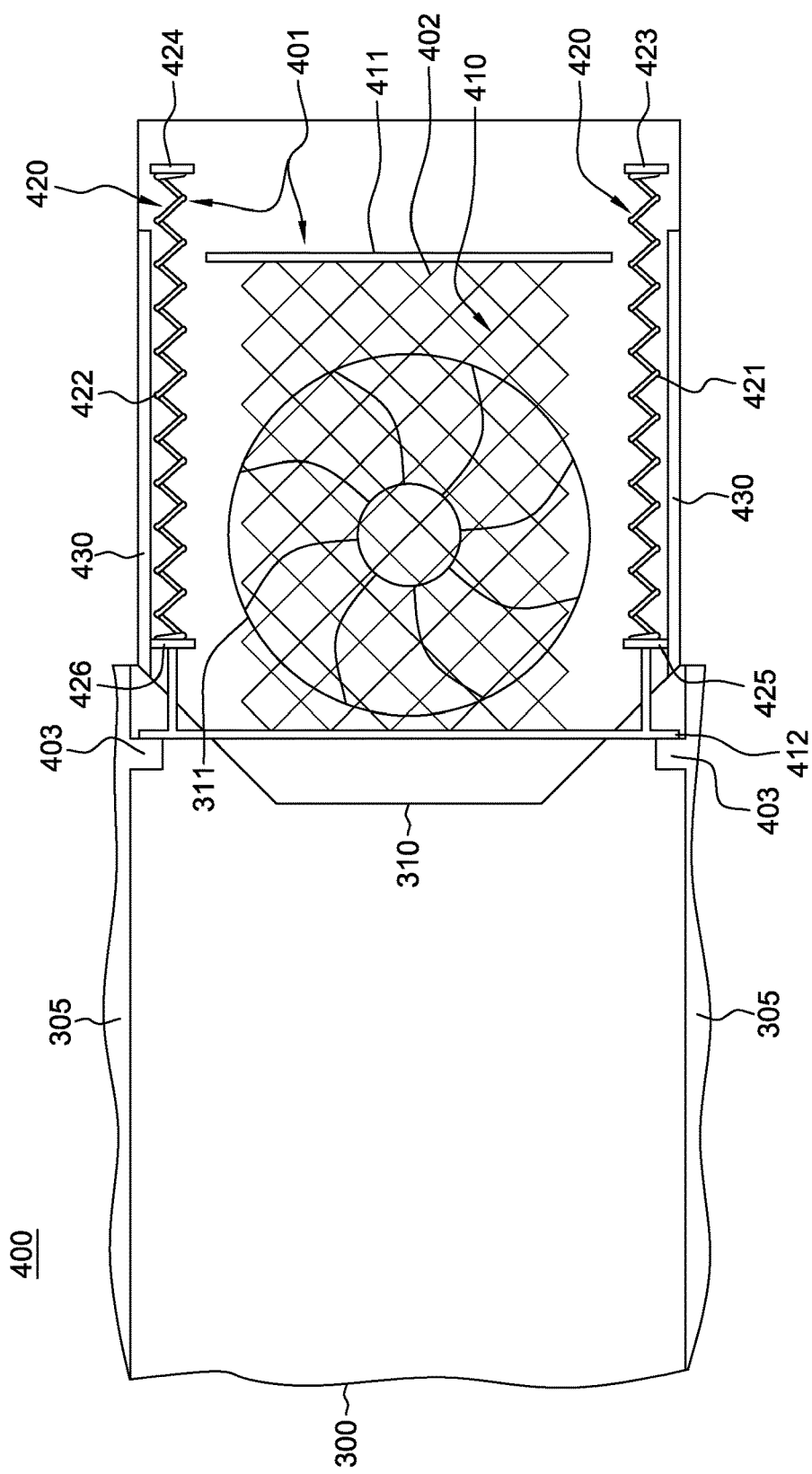
FIG. 4C is a plan view of the apparatus of FIGS. 4A & 4B, with the retractable cover shown in the extended state, covering (at least in part) the air inlet of the air-moving assembly, as the air-moving assembly withdrawn from operative position within the chassis, in accordance with one or more aspects of the present invention.

FIGS. 4A-4C depict one embodiment of an apparatus 400, in accordance with one or more aspects of the present invention. Referring collectively to these figures, apparatus 400 includes, by way of example, air-moving assembly 310, such as described above in connection with FIG. 3B, and a protective cover assembly 401, which includes (in the depicted embodiment) a retractable cover 410 and a spring-biasing mechanism 420 coupled to retractable cover 410. In one embodiment, air-moving assembly 310 may comprise a centrifugal fan 313, which may be disposed, for instance, at the air outlet side of an electronic subsystem chassis 300, such as discussed above in connection with FIGS. 1 & 3A, 3B. As noted, in this configuration, air is drawn in through air inlet 311 and expelled through air outlet 312 (see FIG. 3B).

In FIGS. 4A & 4B, retractable cover 410 is shown in retracted state, with the retractable cover 410 and spring-biasing mechanism 420 retracted away from air inlet 311, while in FIG. 4C, retractable cover 410 and spring-biasing mechanism 420 are shown in an extended state, with the retractable cover substantially covering air inlet 311 of air-moving assembly 310 as the air-moving assembly is being withdrawn from chassis 300. Various retractable cover and spring-biasing configurations are possible. In the embodiment of FIGS. 4A-4C, the retractable cover 410 includes an accordion mesh cover 402 attached at one end to a fixed bar or plate 411, and at an opposite end, to a movable crossbar 412. As illustrated, movable crossbar 412 is sized to span air inlet 311, and reciprocates between the retracted position illustrated in FIGS. 4A & 4B, and the extended position depicted in FIG. 4C. The extended position of FIG. 4C is the natural state for the protective cover assembly, with the spring-biasing mechanism 420 applying bias to maintain crossbar 412 and retractable cover 410 extended, as shown.

As air-moving assembly 310 is inserted into the chassis, for instance, within a respective receiving slot defined, at least in part, by receiving tracks 305 of chassis 300, one or more chassis tabs 403 associated, for example, with receiving tracks 305, may extend into one or more slots 430 in the air-moving assembly 310 enclosure, to engage movable crossbar 412, as depicted. As an operator slides the air-moving assembly into the chassis, chassis tabs 403 push against movable crossbar 412, compressing spring-biasing mechanism 420 to allow retractable cover 410 to achieve the retracted state depicted in FIGS. 4A & 4B.

Those skilled in the art will note that, in the implementation of FIGS. 4A-4C, chassis tabs 403, enclosure slots 430, and protective cover assembly 401, are located and configured to operatively engage in the manner as described herein. Rather than engaging through the sides of the air-moving assembly's enclosure as shown, the chassis tab(s) could, for instance, in another embodiment, be provided to extend through a lower surface of the air-moving assembly enclosure, assuming that there is sufficient spacing between the impeller and the bottom surface of the enclosure. Note that in one or more of the embodiments described herein, the protective cover assembly is assumed to reside within the enclosure of the air-moving assembly. In one or more other embodiments, the protective cover assembly could be attached to the exterior of the enclosure.

As illustrated, spring-biasing mechanism 420 may include one or more linear spring mechanisms, with two linear spring mechanisms being depicted in FIGS. 4A-4C. In the depicted embodiment, the linear spring mechanisms include a first spring 421, and a second spring 422, which are respectively secured at one end to a fixed backplate or stop 423, 424, and at another end to movable bars 425, 426. In one or more embodiments, movable bars 425, 426 are secured or coupled to movable crossbar 412, such as illustrated in FIGS. 4A & 4C.

FIG. 5 depicts an alternate embodiment of an apparatus 400', in accordance with one or more aspects of the present invention. As illustrated, apparatus 400' includes, by way of example, air-moving assembly 310, as described above, and a protective cover assembly 401', which includes (in the depicted embodiment) a retractable cover 410' and spring-biasing mechanism 420. In one embodiment, air-moving assembly 310 may comprise a centrifugal fan, which draws air in through an air inlet 311 in, for instance, a lower surface, of the air-moving assembly enclosure.

In FIG. 5, retractable cover 410' is shown in extended state, with spring-biasing member 420 shown in a natural, extended position, where the retractable cover 410' substantially covers air inlet 311 of air-moving assembly 310 as the air-moving assembly is withdrawn from chassis 300. As noted above, various retractable cover and spring-biasing configurations are possible. In the embodiment of FIG. 5, retractable cover 410' includes a cover sheet 500 attached at one end to a torsion spring assembly 501, and at an opposite end to movable crossbar 412. Cover sheet 500 may be implemented as, for instance, a thin metal or polymer mesh sheet material that, in its installed position, may roll to the right, around torsion spring assembly 501. By design, spring-biasing mechanism 420 provides a greater biasing force than the counteracting force of torsion spring assembly 501 to facilitate unwinding of cover sheet 500 to the extended state illustrated in FIG. 5, as the air-moving assembly is withdrawn from the chassis.

In particular, with the air-moving assembly installed in operative position within the chassis, the one or more linear springs of spring-biasing mechanism 420 will be compressed, allowing the retractable cover to be in retracted state. In this position, the cover sheet is wound around the torsion spring, and the torsion spring is in its natural, un-extended state. As the air-moving assembly is removed from the chassis, and the chassis tabs 403 recede back along the air-moving enclosure slot(s) 430, the spring-biasing mechanism 420 extends out the retractable cover 410' to its extended state, unrolling the cover sheet 500 from torsion spring assembly 501, and placing the torsion spring assembly 501 in tension. As noted, this tension is insufficient to work against the primary spring-biasing mechanism 420, thus ensuring that the retractable cover 410' remains in extended state, covering the adjacent air inlet 311 of air-moving assembly 310.

In operation, as air-moving assembly 310 is inserted into the chassis, that is, within a respective receiving slot defined, for instance, by receiving tracks 305 of chassis 300, one or more chassis tabs 403 associated with the receiving tracks extend into one or more slots 430 in the air-moving assembly 310 enclosure to engage movable crossbar 412, as depicted in FIG. 5. As an operator continues to slide air-moving assembly 310 into the chassis 300, chassis tabs 403 push against movable crossbar 412, compressing spring-biasing mechanism 420 and allowing retractable cover 410' to achieve its retracted state, similar to that shown in FIGS. 4A & 4B. During this transition, torsion spring assembly 501 facilitates rolling of cover sheet 500 or screen from its extended state into a wound or compressed state.

Figure 6A:
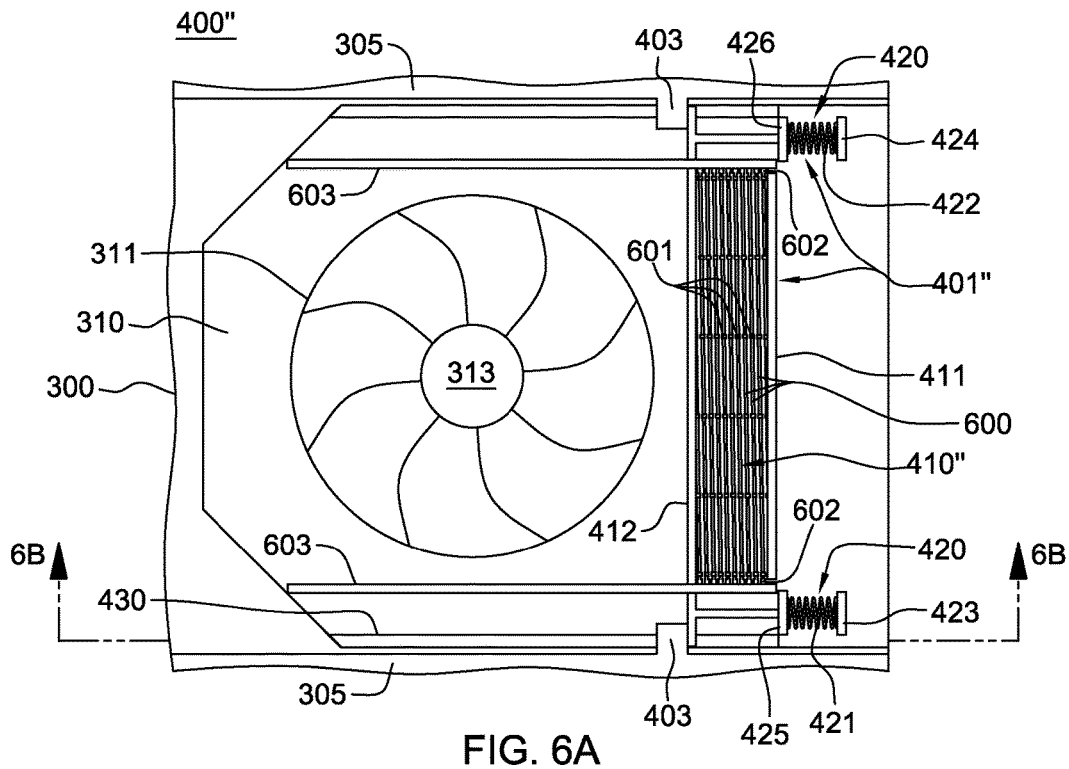
FIG. 6A is a plan view of a further embodiment of an apparatus comprising an air-moving assembly and a protective cover assembly, with the air-moving assembly shown in operative position within a chassis, in accordance with one or more aspects of the present invention.
Figure 6B:
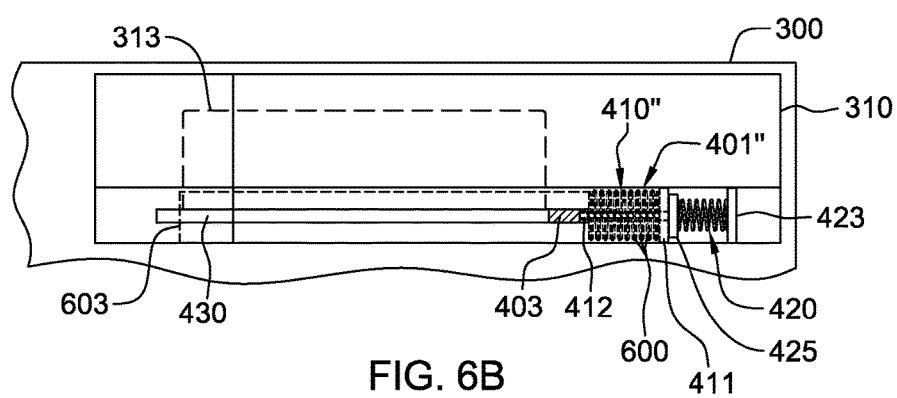
FIG. 6B is an elevational view of the apparatus of FIG. 6A, taken along line 6B-6B thereof, with the retractable cover disposed in retracted state, retracted from the air-moving assembly inlet or outlet, in accordance with one or more aspects of the present invention.
Figure 6C:
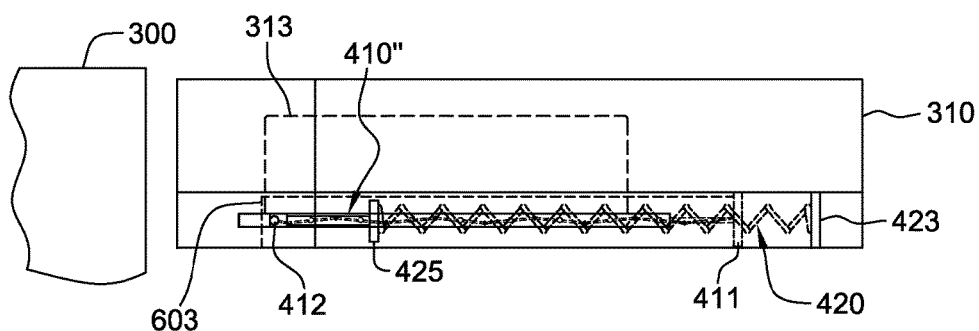
FIG. 6C is an elevational view of the apparatus of FIGS. 6A & 6B, with the air-moving assembly shown withdrawn from the chassis, and the retractable cover extended to the extended state covering, at least in part, the air-moving assembly inlet or outlet, in accordance with one or more aspects of the present invention.

FIGS. 6A-6C depict a further embodiment of an apparatus 400", in accordance with one or more aspects of the present invention. Referring collectively to these figures, apparatus 400" includes, by way of example, air-moving assembly 310, such as described above in connection with FIG. 3B, and a protective cover assembly 401", which includes (in the depicted embodiment) a retractable cover 410" and spring-biasing mechanism 420 coupled to retractable cover 410". As noted, in one embodiment, air-moving assembly 310 may comprise a centrifugal fan, and may be disposed, for instance, within an electronic subsystem chassis, such as described above in connection with FIGS. 1, 3A & 3B.

In FIGS. 6A & 6B, retractable cover 410" is shown in retracted state, with retractable cover 410" and spring-biasing mechanism 420 retracted away from air inlet 311, while in FIG. 6C, retractable cover 410" and spring-biasing mechanism 420 are shown in an extended state, with the retractable cover substantially covering air inlet 311 as air-moving assembly 310 is withdrawn from chassis 300. As noted, various retractable cover and spring-biasing configurations are possible. In the embodiment of FIGS. 6A-6C, the retractable cover includes a plurality of slats 600 connected together via coupling rings 601 along their edges. The number and size of the plurality of slats 600 may be specified to substantially cover the associated air inlet or air outlet opening of the air-moving assembly when in extended state. The protective cover assembly may further include first and second tracks 603 secured to air-moving assembly 310 on opposite sides of air inlet opening 311 (by way of example), and the plurality of slats 600 may further include a plurality of slat tabs 602 disposed at opposite ends thereof, with the plurality of slat tabs 602 moving within the respective first and second tracks 603 of protective cover assembly 401", with extension or retraction of the retractable cover 410". Note that the plurality of slats 600 could be fabricated of various materials, including thin metal or plastic elements which are coupled together using the coupling rings, such as small rings or twine, or other suitable coupling methods.

In operation, as the air-moving assembly 310 is inserted into chassis 300, for instance, within a respective slot defined by receiving tracks 305 of chassis 300, one or more chassis tabs 403 associated with or secured to the chassis 300 or receiving track 305 may extend into the one or more slots 430 in the air-moving assembly 310 enclosure, to engage movable crossbar 412, as depicted, and as described above. As the operator continues to slide the air-moving assembly into the chassis, chassis tabs 403 continue to push against movable crossbar 412, compressing spring-biasing mechanism 420 to allow retractable cover 410" to achieve the retracted state depicted in FIGS. 6A & 6B. In this state, the plurality of slats 600 stack one-against-the-other, away from the air inlet 311 of the air-moving assembly. Once the air-moving assembly is removed from the chassis, spring-biasing mechanism 420 pushes against movable crossbar 412, causing the plurality of slats 600 to unfold from their retracted state to an extended state, covering the air-moving assembly opening, as depicted in the elevational view of FIG. 6C. As noted, slat tabs 602, such as cylindrical tabs at the ends of the slats 600, allow the slats 600 to stay in respective tracks 603, for instance, respective metal tracks, secured to the inner surface of the air-moving assembly 310 enclosure. This ensures that the slats 600 fold up and extend out efficiently. Note that similar tab and track features could be provided with the protective cover assemblies 401, 401' described above in connection with the embodiments depicted in FIGS. 4A-5, as well.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An apparatus comprising:
a protective cover assembly configured to couple to an air-moving assembly adjacent to one of an air inlet or an air outlet thereof, the air-moving assembly with the protective cover assembly coupled thereto being removable together from a chassis within which the air-moving assembly resides in an operative position, the protective cover assembly comprising:
a retractable cover, the retractable cover being in a retracted state when the air-moving assembly is operatively positioned within the chassis, and transitioning to an extended state when the air-moving assembly is withdrawn from the chassis, wherein in the retracted state, the retractable cover is retracted away from the one of the air inlet or the air outlet of the air-moving assembly, and in the extended state, the retractable cover covers, at least in part, the one of the air inlet or the air outlet of the air-moving assembly;
a spring-biasing mechanism coupled to the retractable cover, the spring-biasing mechanism biasing the cover to the extended state when the air-moving assembly is withdrawn from the chassis, and compressing to allow transition of the retractable cover to the retracted state as the air-moving assembly is inserted into the operative position within the chassis; and
a movable crossbar coupled to the retractable cover and the spring-biasing mechanism, and sized to span, at least partially, the one of the air inlet or the air outlet of the air-moving assembly when the protective cover assembly is coupled thereto, wherein one or more chassis tabs engage the movable crossbar with insertion of the air-moving assembly into the operative position within the chassis, the engaging compressing the spring-biasing mechanism and allowing the transition of the retractable cover to the retracted state, retracted from the one of the air inlet or the air outlet of the air-moving assembly.

2. The apparatus of claim 1, wherein the spring-biasing mechanism comprises at least one linear spring mechanism sized and configured to bias the retractable cover in the extended state when the protective cover assembly is coupled to the air-moving assembly and the air-moving assembly is withdrawn from the chassis, and to compress to allow the transition of the retractable cover to the retracted state as the air-moving assembly is inserted in the operative position within the chassis.

3. The apparatus of claim 1, wherein the retractable cover comprises an accordion mesh cover configured to substantially cover the one of the air inlet or air outlet when the protective cover assembly is coupled to the air-moving assembly, and the retractable cover is in the extended state.

4. The apparatus of claim 1, wherein the retractable cover comprises a plurality of slats connected together via coupling rings along their edges, the plurality of slats being configured to substantially cover the one of the air inlet or the air outlet in the extended state as the air-moving assembly is withdrawn from the chassis.

5. The apparatus of claim 4, wherein the protective cover assembly further comprises first and second tracks to couple to the air-moving assembly on opposite sides of the one of the air inlet or air outlet, and wherein the plurality of slats further comprise a plurality of slat tabs disposed at opposite ends thereof, the plurality of slat tabs moving within the respective first and second tracks of the protective cover assembly with extension or retraction of the retractable cover.

6. The apparatus of claim 1, wherein the air-moving assembly comprises a centrifugal fan, and the protective cover assembly couples to the air-moving assembly adjacent to the air inlet thereof to protectively cover the air inlet as the air-moving assembly is withdrawn from the operative position within the chassis.

7. An apparatus comprising:
an air-moving assembly, the air-moving assembly residing within a chassis when in an operative position, and the air-moving assembly comprising an air inlet and an air outlet; and
a protective cover assembly, the protective cover assembly being coupled to the air-moving assembly adjacent to one of the air inlet or the air outlet, the air-moving assembly with the protective cover assembly coupled thereto being removable together from the chassis within which the air-moving assembly resides in the operative position, the protective cover assembly comprising:
  a retractable cover, the retractable cover being in a retracted state when the air-moving assembly is operatively positioned within the chassis, and transitioning to an extended state when the air-moving assembly is withdrawn from the chassis, wherein in the retracted state, the retractable cover is retracted away from the one of the air inlet or the air outlet of the air-moving assembly, and in the extended state, the retractable cover covers, at least in part, the one of the air inlet or the air outlet of the air-moving assembly;
  a spring-biasing mechanism coupled to the retractable cover, the spring-biasing mechanism biasing the retractable cover in the extended state when the air-moving assembly is withdrawn from the chassis, and compressing to allow transition of the retractable cover to the retracted state as the air-moving assembly is inserted into the operative position within the chassis; and
  a movable crossbar coupled to the retractable cover and the spring-biasing mechanism, and sized to extend, at least partially, across the one of the air inlet or the air outlet of the air-moving assembly, wherein one or more chassis tabs extend into one or more slots in the air-moving assembly and engage the movable crossbar with insertion of the air-moving assembly into the operative position within the chassis, the engaging compressing the spring-biasing mechanism and allowing the transition of the retractable cover to the retracted state, retracted from the one of the air inlet or the air outlet of the air-moving assembly.

8. The apparatus of claim 7, wherein the retractable cover comprises an accordion mesh cover configured to substantially cover the one of the air inlet or the air outlet when the retractable cover is in the extended state.

9. The apparatus of claim 7, wherein the retractable cover comprises a plurality of slats connected together via coupling rings along their edges, the plurality of slats being configured to substantially cover the one of the air inlet or the air outlet in the extended state as the air-moving assembly is withdrawn from the chassis.

10. The apparatus of claim 9, wherein the protective cover assembly further comprises first and second tracks coupled to the air-moving assembly on opposite sides of the one of the air inlet or the air outlet, and wherein the plurality of slats further comprise a plurality of slat tabs disposed at opposite slat thereof, the plurality of slat tabs moving within the respective first and second tracks of the protective cover assembly with extension or retraction of the retractable cover.

11. The apparatus of claim 7, wherein the air-moving assembly comprises a centrifugal fan, and the protective cover assembly couples to the air-moving assembly adjacent to the air inlet thereof to protectively cover the air inlet as the air-moving assembly is withdrawn from the operative position within the chassis.

12. A method comprising:
  associating a protective cover assembly with an air-moving assembly adjacent to one of an air inlet or an air outlet thereof, the air-moving assembly residing within a chassis when in an operative position and the air-moving assembly with the protective cover assembly coupled thereto being removable together from the chassis, the protective cover assembly comprising:
    a retractable cover, the retractable cover being in a retracted state when the air-moving assembly is operatively positioned within the chassis, and transitioning to an extended state when the air-moving assembly is withdrawn from the chassis, wherein in the retracted state, the retractable cover is retracted away from the one of the air inlet or the air outlet of the air-moving assembly, and in the extended state, the retractable cover covers, at least in part, the one of the air inlet or the air outlet of the air-moving assembly;
    a spring-biasing mechanism coupled to the retractable cover, the spring-biasing mechanism biasing the retractable cover in the extended state when with the air-moving assembly is withdrawn from the chassis, and compressing to allow transition of the retractable cover to the retracted state as the air-moving assembly is inserted into the operative position within the chassis; and
    a movable crossbar coupled to the retractable cover and the spring-biasing mechanism, and sized to span, at least partially, the one of the air inlet or the air outlet of the air-moving assembly when the protective cover assembly is coupled thereto, wherein one or more chassis tabs engage the movable crossbar with insertion of the air-moving assembly into the operative position within the chassis, the engaging compressing the spring-biasing mechanism and allowing the transition of the retractable cover to the retracted state, retracted from the one of the air inlet or the air outlet of the air-moving assembly.

13. The method of claim 12, wherein the spring-biasing mechanism comprises at least one linear spring sized and configured to bias the retractable cover in the extended state when the air-moving assembly is withdrawn from the operative position within the chassis, and to compress to allow transition of the retractable cover to the retracted state as the air-moving assembly is operatively positioned within the chassis.

* * * * *